United States Patent [19]

Galli et al.

[11] 3,781,596

[45] Dec. 25, 1973

[54] SEMICONDUCTOR CHIP CARRIERS AND STRIPS THEREOF

[76] Inventors: Richard J. Galli, 2132-A Haven Rd.; Denis G. Kelemen, 6 Gumwood Dr., both of Wilmington, Del.

[22] Filed: July 7, 1972

[21] Appl. No.: 269,575

Related U.S. Application Data

[63] Continuation of Ser. No. 118,803, Feb. 25, 1971, abandoned.

[52] U.S. Cl. .................. 317/101 F, 29/625, 29/626, 174/DIG. 3, 174/68.5, 317/101 CC, 317/234 G, 317/234 M

[51] Int. Cl. .............................................. H05k 3/32

[58] Field of Search ................... 174/DIG. 3, 52 PE, 174/52 S, 68.5; 317/234 G, 234 E, 234 H, 101 CC, 101 CP, 234 M; 29/193.5, 191, 195, 625, 626, 577, 588–590

[56] References Cited

UNITED STATES PATENTS

| | | | |
|---|---|---|---|
| 3,554,821 | 1/1971 | Caulton et al. | 317/234 G UX |
| 3,440,027 | 4/1969 | Hugle | 317/101 F X |
| 3,514,538 | 5/1970 | Chadwick et al. | 174/68.5 |
| 3,544,857 | 12/1970 | Byrne et al. | 174/DIG. 3 UX |
| 3,562,005 | 2/1971 | De Angelo et al. | 317/101 F UX |
| 3,602,634 | 8/1971 | Meuli | 174/DIG. 3 X |
| 3,662,230 | 5/1972 | Redwantz | 174/DIG. 3 UX |
| 3,665,267 | 5/1972 | Acello | 317/101 CC X |

*Primary Examiner*—Darrell L. Clay
*Attorney*—James A. Forstner

[57] ABSTRACT

Carriers for packaging semiconductor devices. Strips of such carriers. The carriers comprise a flexible transparent film base, and have adherent thereto discretionary conductor patterns and bonding pads on the interior extremities of the conductor patterns.

13 Claims, 18 Drawing Figures

INVENTORS
RICHARD J. GALLI
DENIS G. KELEMEN
BY James A. Forster
ATTORNEY

INVENTORS
RICHARD J. GALLI
DENIS G. KELEMEN

BY James A. Forstn

ATTORNEY

INVENTORS

RICHARD J. GALLI
DENIS G. KELEMEN

BY *James A. Forstner*

ATTORNEY

INVENTORS
RICHARD J. GALLI
DENIS G. KELEMEN

BY James A. Forster
ATTORNEY

INVENTORS
RICHARD J. GALLI
DENIS G. KELEMEN

BY James A. Forstner
ATTORNEY

INVENTORS
RICHARD J. GALLI
DENIS G. KELEMEN

BY James A. Forstner
ATTORNEY

INVENTORS
RICHARD J. GALLI
DENIS G. KELEMEN
BY James A. Forstner
ATTORNEY

INVENTORS
RICHARD J. GALLI
DENIS G. KELEMEN
BY James A. Forster
ATTORNEY

SEMICONDUCTOR CHIP CARRIERS AND STRIPS THEREOF

This application is a continuation of application Ser. No. 118,803, filed Feb. 25, 1971, now abandoned.

CROSS-REFERENCE TO RELATED APPLICATION

This application is related to copending and commonly assigned application Ser. No. 118,805, filed on the same day as the present application, Feb. 25, 1971 and entitled "Semiconductor Chip Packaging Apparatus and Method." The latter application relates to preferred machinery for mounting chips on substrates with the carriers of the present invention.

BACKGROUND OF THE INVENTION

This invention relates to semiconductor chips, and more specifically, to mounting such chips on substrates.

The term "semiconductor device" includes, but is not limited to, diodes, transistors, rectifiers and integrated circuits. Unpackaged semiconductor devices are frequently referrred to as "chips," and are so referred to herein.

Assembly of semiconductor chips into packages has been the subject of much study. Package assembly problems are greatest where the chip is an integrated circuit chip, due to the multiple number of terminals on such chips, each of which must be bonded to a substrate.

The art teaches several ways for assembling chips into a package. Manual die and wire bonding procedures are time consuming and error prone since defects are often generated by manual bonding of wires to chip terminals.

Beam lead bonding requires costly special chips which are several times more expensive than conventional flat chips. Fragile gold leads are formed on the chip edges for bonding purposes and require utmost care in handling of the chips to prevent bending or breakage. Beam lead bonding is easier than in die and wire bonding, but chip heat dissipation is restricted in beam lead bonding.

Solder reflow bonding also requires complicated chips with solder pads at chip terminals and substrates with solder dams. Handling is not as great a problem as with the first two methods and bonding is easier. Heat dissipation is better than with beam lead bonding, but is not as good as the heat dissipation with manual die and wire bonded chips.

Recently developed techniques involve direct bonding of chip terminals to the substrate or package without wires, but have employed chip carriers with windows (cut out of the central portion of the carrier, leaving inboard conductors cantilevered in space) and/or complex chip to package alignment procedures. Since chips are opaque to visible light, such chip to carrier alignment has typically been carried out by such methods as (1) the infrared technique of U.S. Pat. No. 3,465,150 or (2) the use of visible light and mirrors. The carriers of the present invention allow use of direct axial alignment with axial optics, without windows.

There is need for strong, reliable, low electrical resistance package interconnections, made by a simple method for automating chip attachment or package assembly. There is also a definite need for ability to inspect bonded chips prior to commitment of the bonded chips to packages.

Thus, in summary, there is a need for an improved, simplified, and reliable general method of interconnecting chips to the circuitry of a substrate by means of a flexible reliable carrier. Since this invention is intended to be generally applicable, two carrier constructions are described, for compatibility with both standard and special chips (standard chips are those without beams, bumps, or raised pad terminals). Carrier conductors and pads are provided for ultrasonic or thermocompression bonding standard chips with aluminum terminal bonds. The other carrier variation features solder pads for special chips that have tinnable terminal bonds.

SUMMARY OF THE INVENTION

As used herein, the term "carrier" means a multilayer structure used for attaching chips to substrates such as metallized ceramic substrates or metal lead frames. The term "carrier film" means the plastic film base of the carrier of the present invention. By the term "carrier conductor" is meant the metallization pattern on the carrier film. By the term "carrier strip" is meant a plastic film upon which there is a repetitive pattern constituting a series of discretionary carrier conductors, from which chip carriers may be cut as needed, usually after chips have been mounted on the respective carrier units of the strip.

The present invention provides carriers for bonding such chips to a substrate. The carrier comprises (a) a flexible, transparent polymeric film, which is an insulator and supporting base for the remainder of the carrier; (b) metallic conductors on and adherent to film (a) in the desired patterns, whereby electrical contact is made between the chip and the substrate upon packaging; and (c) metal bonding pads on and adherent to the inner ends of (b), which serve as contacts between conductor patterns (b) and the chip. Film (a) is a transparent film, preferably a polyimide. Patterns (b) are usually of substantially uniform thickness, since pads (c) are raised above those patterns (b) and serve to prevent contact between the chips and the patterns (b) except through pads (c). Conductor patterns (b) may be convergent to the center of the carrier.

For standard chips, elements (b) and (c) may be of the same or differing conductive materials; furthermore, (b) and (c) may be coated with a layer of conductive material such as gold, nickel or nickel/boron. Conductors (b) and pads (c) may be of a single metal or may be a multimetal structure, depending upon the desired end use. A preferred carrier structure is that where pads (c) are aluminum and conductors (b) are a multilayer structure of, starting adjacent to film (a), copper, nickel and gold, in sequence; further, there may be additional nickel and copper layers intermediate between the gold layer and the aluminum pad, the area of which layers may be coextensive with either that of conductors (b) or pads (c), to give the following multilayer structure, in sequence: film, copper, nickel, gold, nickel, copper and aluminum. An optimum embodiment includes a layer of chromium or nickel between the film and the copper layer.

For special tinnable chips, pads (c) may be solder.

Also according to this invention there is provided a strip of the inventive carriers, which strip comprises a series of conductor patterns (b) and pads (c) on a continuous film, from which the carriers may be cut as desired. Such strips permit attachment to the individual carrier units thereon of chips, and testing of electrical connections, before final commitment to packages. Chip bonded carriers failing such tests may be rejected prior to commitment to a substrate to form a package. The strips may additionally comprise sprocket holes between the individual carriers, for indexing purposes in automated processes (including handling, bonding and testing operations). Also provided are electronic packages comprising a chip bonded to a substrate via the carrier of the present invention, as well as unfinished packages comprising chips bonded only to carriers, and a series of chips bonded to a carrier strip.

In summary, this invention provides an improved, simplified and highly reliable method of interconnecting semiconductor chips to the circuitry of a substrate package by means of a flexible transparent carrier. The carrier is composed of a film base upon which there is a pattern of discretionary conductors and bonding pads. The film serves as a supporting layer for the conductor pattern which is applied to one surface thereof by selective deposition and/or etching of coatings and raised contact areas. Chips are mounted so that the active chip surface is bonded to the carrier pads, and thereafter connected to the circuitry of the substrate by the discretionary carrier conductor pattern (b). The carrier pads (c) localize the bonding contact area for reliable bonding and raise the carrier conductors of the active surface of the chip, to prevent shorting. The optional registration holes of the carrier film provide means for accurate alignment of chips and carrier contact area.

BRIEF DESCRIPTION OF THE DRAWINGS

In the drawings:

FIGS. 5 show various views of the carrier of FIG. 1*a* incorporated into a package. FIG. 5*b* is a cross section taken along the line 5—5′ in FIG. 5*a.

DETAILED DESCRIPTION OF THE INVENTION

Figures 1A, 1B:
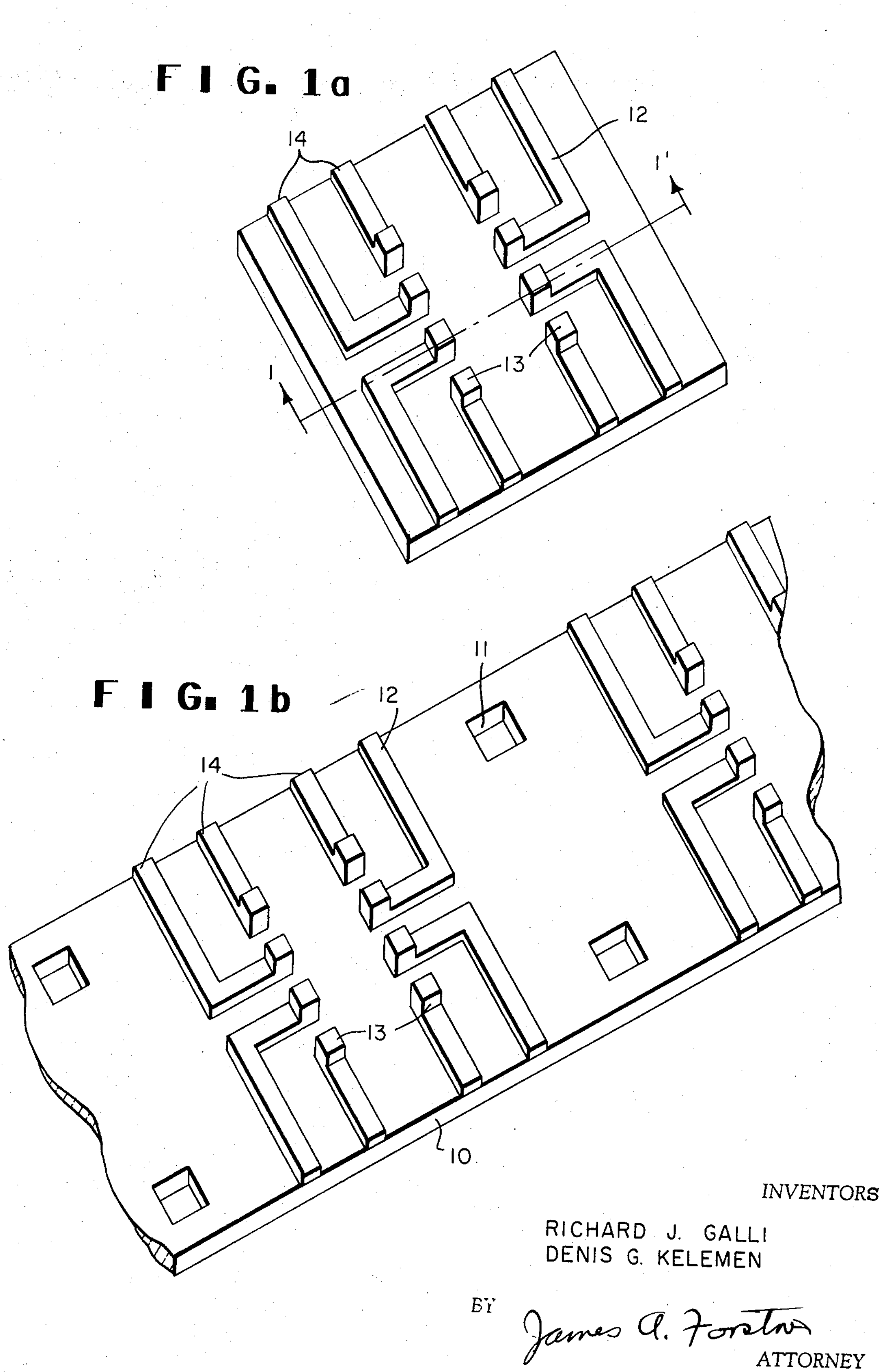
FIG. 1*a* is a perspective view showing the carrier of the present invention.
FIG. 1*b* is a perspective view of the carrier of FIG. 1a as part of a strip of such carriers, the continuous film base having sprocket holes between the individual carrier units for indexing purposes.

The chip carrier of the present invention is illustrated in FIG. 1a as a simple embodiment for use with integrated circuit chips. The carrier comprises a flexible polymeric film base 10. In FIG. 1*b*, film base 10 is illustrated as a continuous film with sprocket holes 11 (discussed below) between individual carriers of the present invention.

Conductor patterns 12 are formed on the carrier film 10. Disposed on the inner ends of conductor patterns 12 are small raised pads 13, to which the chip may be attached. The outer edges of the conductors 12 have test terminals 14, which are used for testing chips bonded to chip carriers before final package fabriaction, that is, bonding of the chip/carrier unit to a substrate. Test probing of only terminals 14 prevents probe damage to the outboard conductor terminals. These edge terminals 14 remain on the carrier selvage when the center portion of the carrier is cut out during bonding the carrier/chip unit to the substrate. The conductor patterns 12 may be of the same or different conductor materials as the pads 13.

The conductor patterns (b) are of substantially uniform thickness on the surface of film (a). The thickness chosen is governed by electrical and mechanical considerations. Since low electrical resistance is desired, thick conductors are indicated. However, mechanical stability is enhanced by thin layers, since thin cross sections minimize stresses resulting from mismatch of material thermal expansion in a multilayer structure. Optimum conductor thickness is thus a compromise, generally in the range of 0.5–2.5 mils, depending on end use.

Pad (c) thickness is determined by bonding requirements, stand-off clearance and pad forming methods. Optimum thickness is a compromise for each use, but is generally in the range of 0.5–1.5 mils.

Film 10 acts as both a "compliant member" during bonding of chips to the carrier and as a convenient protective support for the fragile conductor patterns 12 through fabrication and package assembly. Film 10 further assures that conductor patterns 12 are fully supported and accurately aligned with each other. In addition, film 10 with index holes 11 provides precision registration of the bonding pads 13 to terminals on the chip during bonding. This makes the carrier of the present invention ideally suited for high speed, continuous, automated assembly of packages as described in the above-mentioned copending application Ser. No. 118,805.

Figure 2:
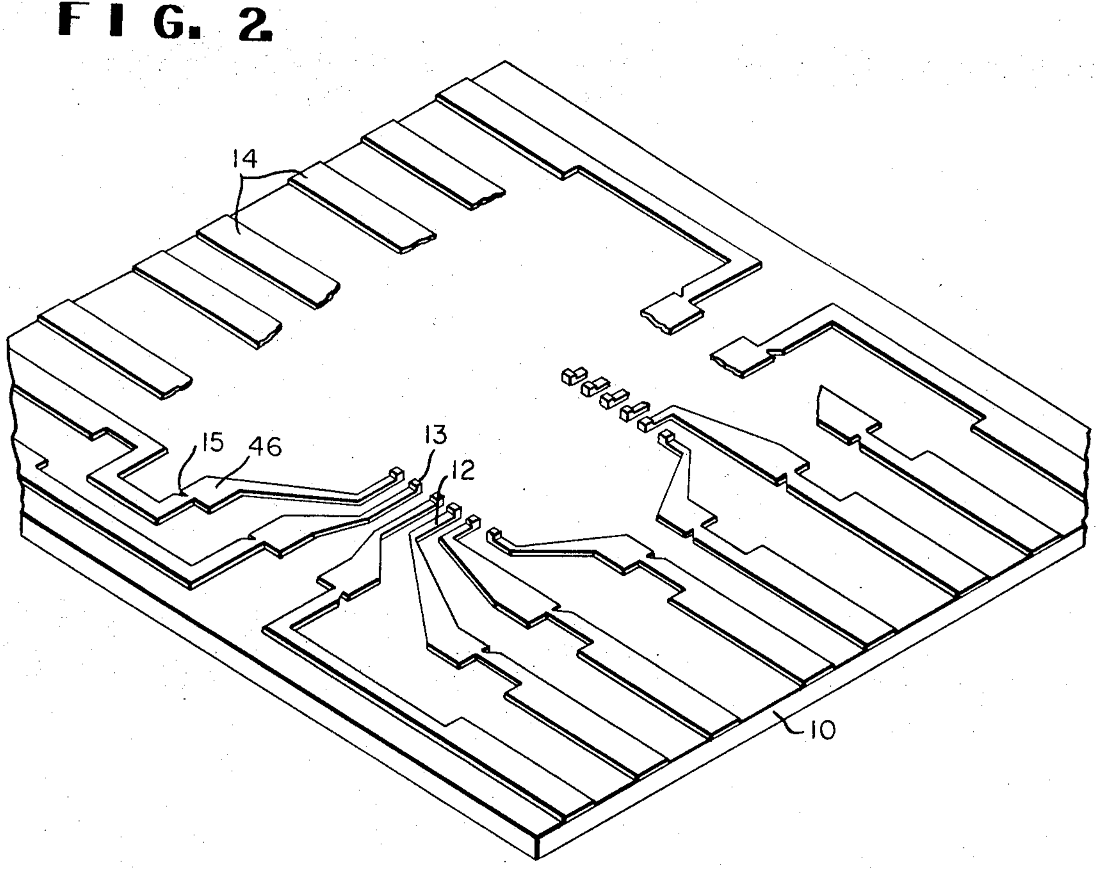
FIG. 2 shows a more complex version of the carrier of the present invention.

FIG. 2 shows a more complex and refined version of the carrier of the present invention. The conductor patterns 12 proceed from the edge of the film 10 to the center of the carrier. Stress notches 15 may be provided to facilitate separation of the conductor during subsequent cut out operations while bonding the chip/carrier unit to a substrate, e.g., by thermocompression or ultrasonic methods. To the center of the carrier, beyond notches 15 and adjacent to them is bonding area 46 where bonding to substrate conductors is accomplished. (Bonding between chip and carrier occurs at pads 13.) The size of bonding areas 46 interior to the notches is typically 10 to 20 mils square, but may be varied widely. The carrier conductor lines 12 narrow down in width and spacing (but not cross sectional thickness) as they converge toward the chip bonding area of the carrier. The ends of the conductor lines at the terminal points within the chip bonding area are provided with the above-mentioned raised pads 13 to facilitate chip attachment to the conductor patterns 12.

Each of the bonding surfaces of the pads 13 is typically 3 to 4 mils square and is accurately located to align with terminals on the chip. The surface area of pad 13 is smaller than that of the chip terminal (typically 4 to 5 mils square) to facilitate (a) contact of pad 13 only on the chip terminal and (b) some degree of clearance for registration errors and tolerance.

Film 10 is a polymeric composition which is flexible and transparent. The preferred polymeric compositions are the polyimides, such as Du Pont "Kapton" polyimide film. Such polyimides are described, for example, in U.S. Pat. Nos. 3,179,614 and 3,179,634, both to Edwards. The thickness of film 10 may be varied widely, as desired. Illustrative of typical film thicknesses used are those in the range of 0.5–3 mils. Because of thermal expansion mismatch with the metallic conductors and substrates (e.g., ceramics), a minimum thickness is desired. Once the package has been formed, the film functions as a protective sheet over the active chip surface and holds the carrier conductors in place.

FIGS. 3 depict cross sections of various embodiments of the carrier of the present invention, taken along the line 1—1' in FIG. 1*a*. Thus, FIG. 3*a* illustrates the embodiment where conductor patterns 12 and pads 13 are of the same conductive material. Illustrative of materials useful in this embodiment are gold and aluminum.

Figure 3A:
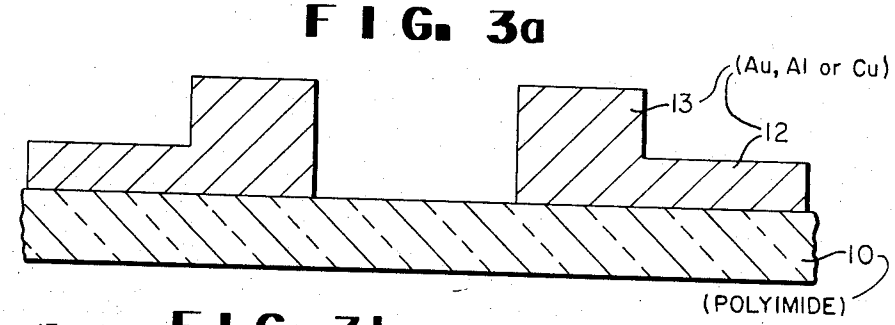
FIGS. 3 show cross sections of part of the carrier of FIG. 1*a*, taken along the line 1—1′ in FIG. 1*a*. Various materials of construction are indicated, as described below.
Figure 3B:
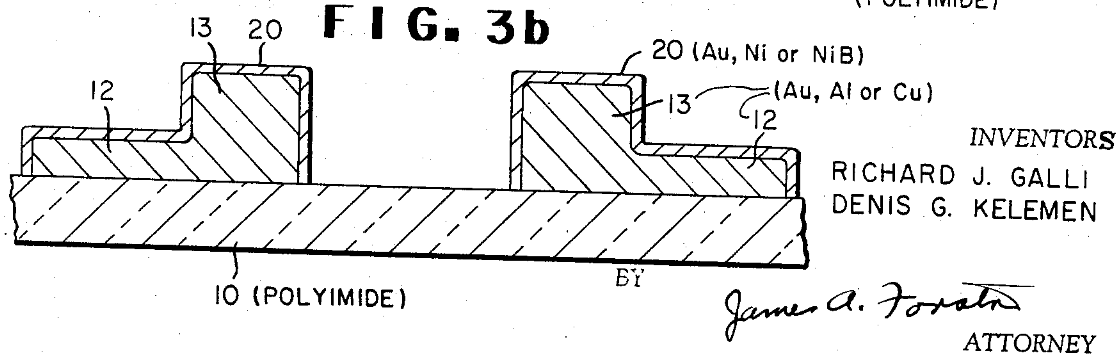

FIG. 3*b* illustrates the embodiment of this invention where conductor patterns 12 and pads 13 are of the same material, but are also coated with a layer 20 of another material. Illustrative of materials useful as such coating materials 20, where 12 and 13 are copper, are gold, nickel or nickel/boron. The application of nickel/boron coatings is well known to the art. Exemplary of patents dealing with nickel/boron coatings are Berzins U.S. Pat. Nos. 3,045,334; 3,096,182; and 3,338,726. The thickness of such nickel/boron coatings is a matter of selection. Typically, we have used thicknesses of about 20 millionths to 0.2 mil.

Figure 3C:
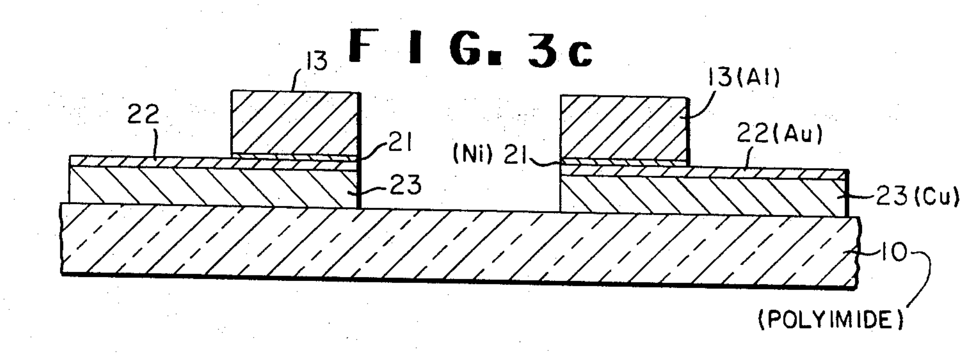

FIG. 3*c* illustrates an embodiment wherein conductor patterns 12 constitute a multilayer structure. Here pads 13 are aluminum, to give a known chip bonding metallury to standard chips, and adjacent to pads 13 is a layer of nickel 21, to prevent intermetallic formation from diffusion between aluminum pads 13 and the adjacent layer 22. Layer 21 is depicted as covering only the area of pad 13, but may if desired cover most of the entire area of layer 22. Layer 22 is a thin layer of gold, on copper layer 23, The conductors are firmly attached to film 10.

Figure 3D:
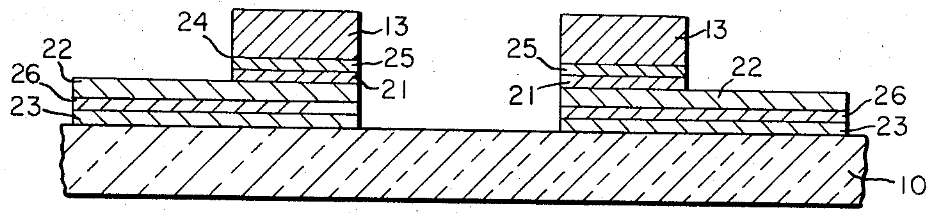

In the embodiment of FIG. 3*c* additional layers may be required to render the various metallic layers of FIG. 3*c* more firmly adherent to one another. FIG. 3*d* illustrates a preferred embodiment of the present invention wherein pads 13 are aluminum, and adjacent to pads 13, in sequence, there are the following layers, to enhance bonding and adhesion: copper 25, nickel 21, gold 22, nickel 26, copper 23, and an optional layer of chromium or nickel, followed by film 10. Furthermore, surface 24 of aluminum pads 13 which is to be adjacent to copper layer 25 may be treated with a zincate solution, described below, to enhance adhesion.

Figure 3E:
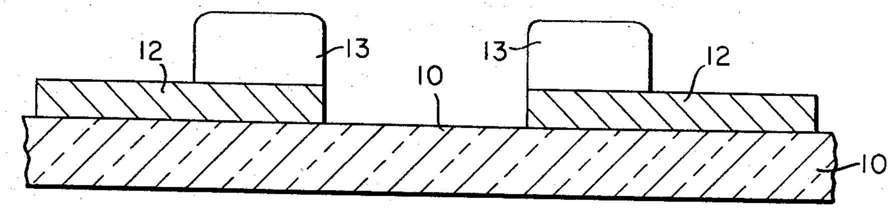

FIG. 3*e* represents an embodiment of the present invention wherein pads 13 on conductor patterns 12 are of solder. Typical solder compositions can be used here, for example, 90 percent Pb/10 percent Sn; or 95 percent Pb/5 percent Sn; or 60 percent Sn/38 percent Pb/2 percent Ag. The basic compositional requirement is that the solder be compatible with the silicon chip and the final package, i.e., the melting point of the solder is high enough to withstand subsequent outboard bonding without permitting remelting.

Figure 4:
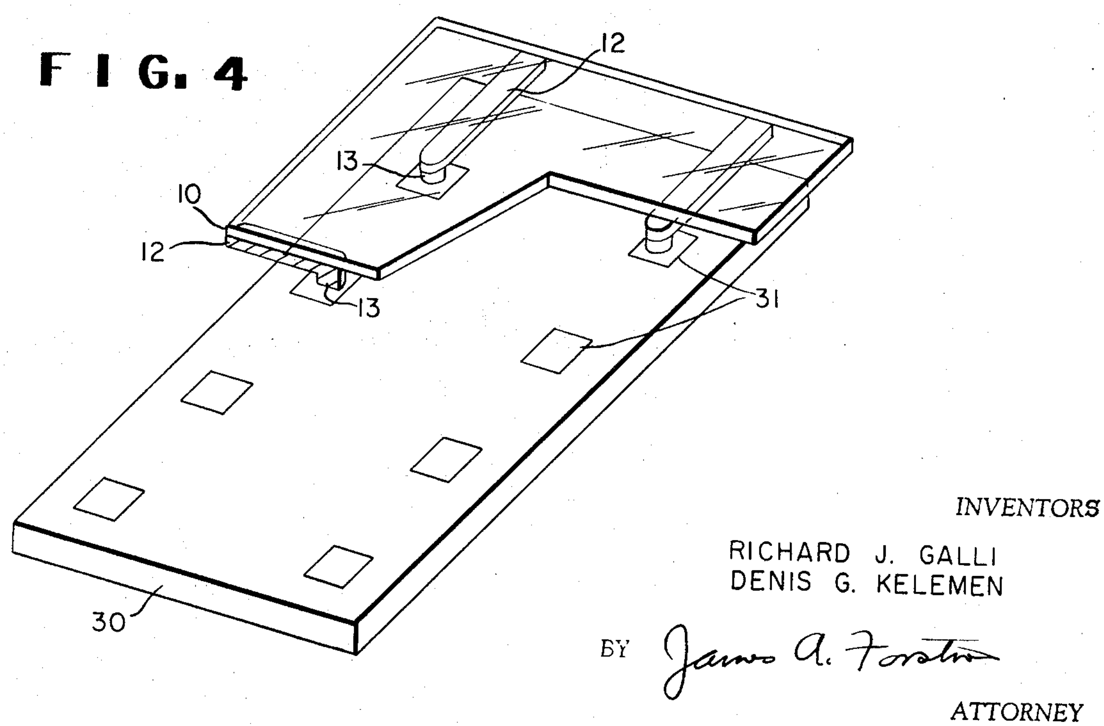
FIG. 4 shows an enlarged view of the joint between inboard metal pads on the carrier and those on an integrated circuit chip.

The carriers of the present invention may be used to align integrated circuit chips on substrates in a variety of ways, including optical alignment. A preferred method of employing transparent carriers of the present invention is described in the above-mentioned copending application Ser. No. 118,805. FIG. 4 shows an enlarged view of the joint between an integrated circuit chip 30 and the carrier of the present invention. The carrier comprises a transparent film 10, conductor patterns 12, and pads 13, bonded to terminals 31 on chip 30. Typically, the terminals 31 on the surface of the chip 30 are of aluminum. In FIG. 4 carrier film 10 is cut away for more easy understanding.

This invention also provides packages of chips bonded to substrates via the carriers of the present invention. FIGS. 5 illustrate one embodiment of such packages, wherein the substrate may be a metallized ceramic. FIGS. 6 illustrate another embodiment of this invention, wherein the substrate is a metal lead frame.

Figure 5A:
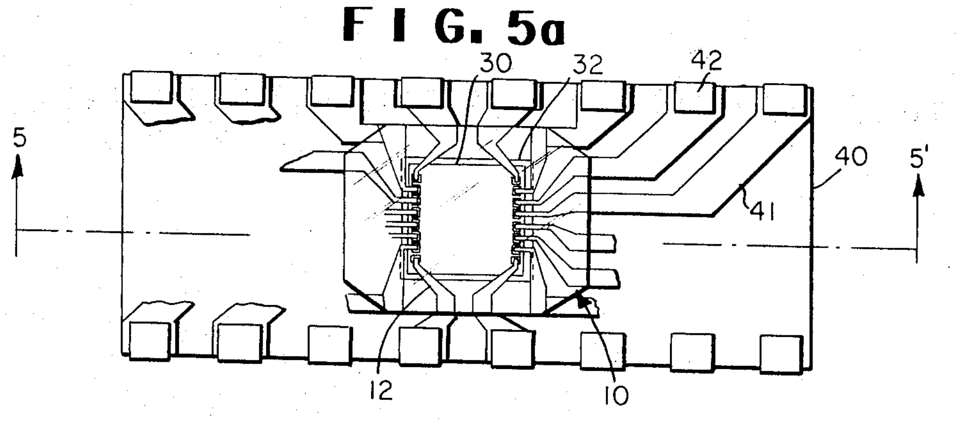
FIG. 5*a* is a top view of the package.

FIG. 5*a* is an overhead view of a single-carrier package utilizing the carrier of the present invention. A chip 30 is attached to a ceramic substrate 40 via a die bonding pad 32 on the substrate. A lead frame 42 is brazed or soldered to conductor 41 on substrate 40 to provide an external connection means. The carrier connects the upper or active face of the chip 30 to the substrate conductor 41 through the pads 13 and conductors 12.

Figure 5B:
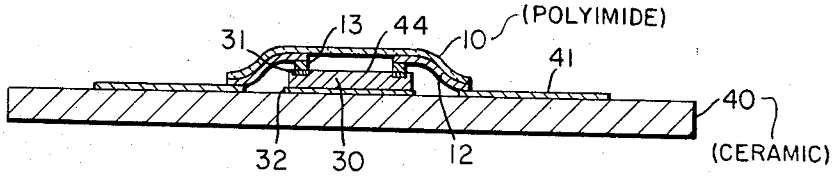
Figure 5C:
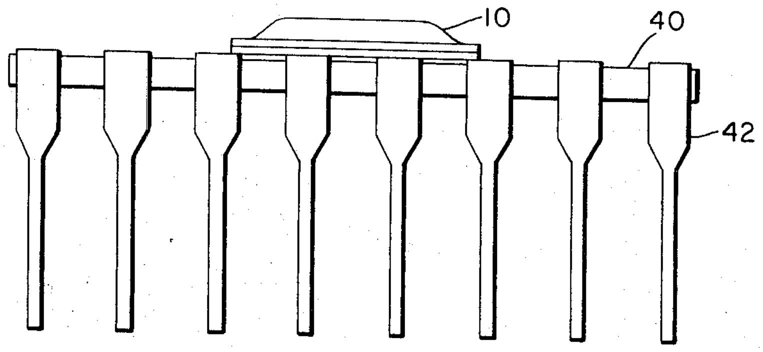
* and FIG. 5*c* is a side view of the package of FIG. 5*a*.

FIG. 5*b* is a cross section of FIG. 5*a* taken along the line 5—5', showing the interconnecting functions of the carrier of the present invention. The active face 44 of the chip 30 is shown in FIG. 5*b*. FIG. 5*c* is a side view of the assembled device of FIG. 5*a*. Not shown, but optional and preferable, is a lid or other protective encapsulation.

Of course, the present invention is not limited to single carrier device embodiments. Multi-device embodiments containing large carriers or several carriers are possible. Thus, a carrier may hold two or more chips to the substrate conductors. Interconnection can be made through the carrier directly from chip to chip without contacting the substrate conductors.

Figure 6A:
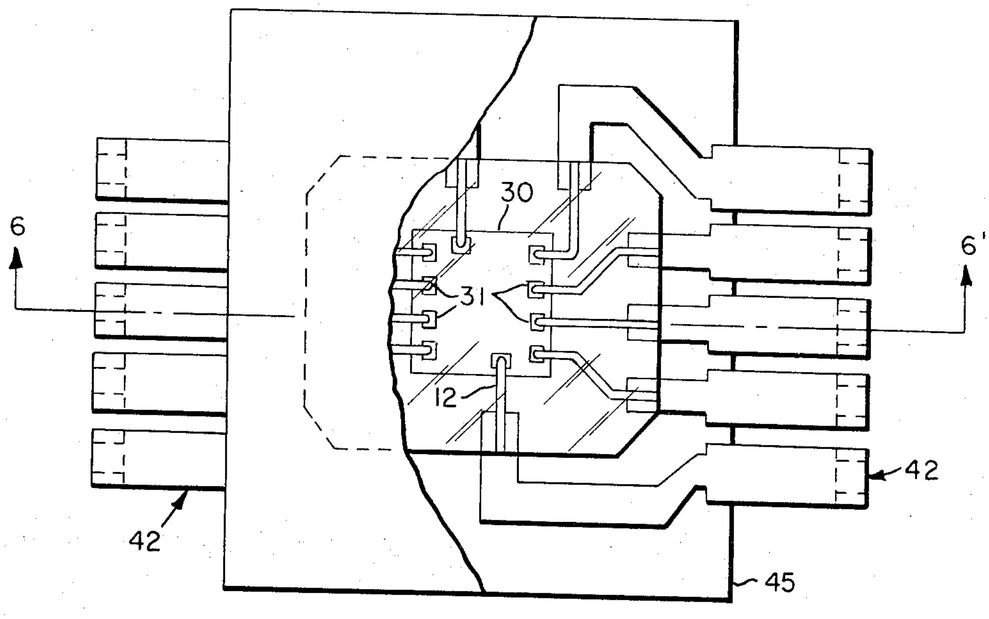
FIGS. 6 show views of a package according to the present invention wherein the substrate to which the carrier/chip unit is committed is a lead frame later encapsulated in plastic.
FIG. 6B is a cross section taken perpendicular to the line 6—6′ of the top view in FIG. 6*a*.
Figure 6B:
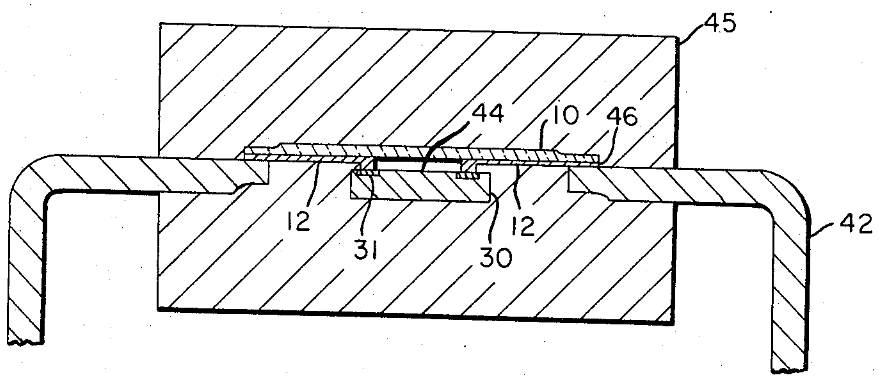

FIGS. 6 illustrate another embodiment of the present invention wherein the substrate is a lead frame, rather than a metallized ceramic; plastic is used to encapsulate the entire structure. FIG. 6*a* shows a partially cut away overhead view of such a plastic package containing a fully encapsulated chip mounted on the carrier of the present invention, the conductors 12 of the carrier connecting the chip terminal pads 31 to lead frame 42. A plastic encapsulant 45 protects the device and forms the package body. FIG. 6*b* shows a cross section taken along the line 6—6' in FIG. 6*a*. Chip 30 is shown with chip terminal pads 31 on the active face 44 of the chip, connected to carrier conductors 12. Carrier conductors 12 are, in turn, bonded to lead frame 42 at the outboard site 46. Carrier film 10 is left in place as encapsulant 45 is applied and hardened. Materials useful as encapsulant 45 are any of the standard embedding resins such as epoxies, polyesters, silicones, polyurethanes. Selection is dependent on end use. The encapsulant protects the chip from mechanical damage and moisture. The resin may be applied by methods such as dipping, coating or injection molding.

Figures 7, 8:
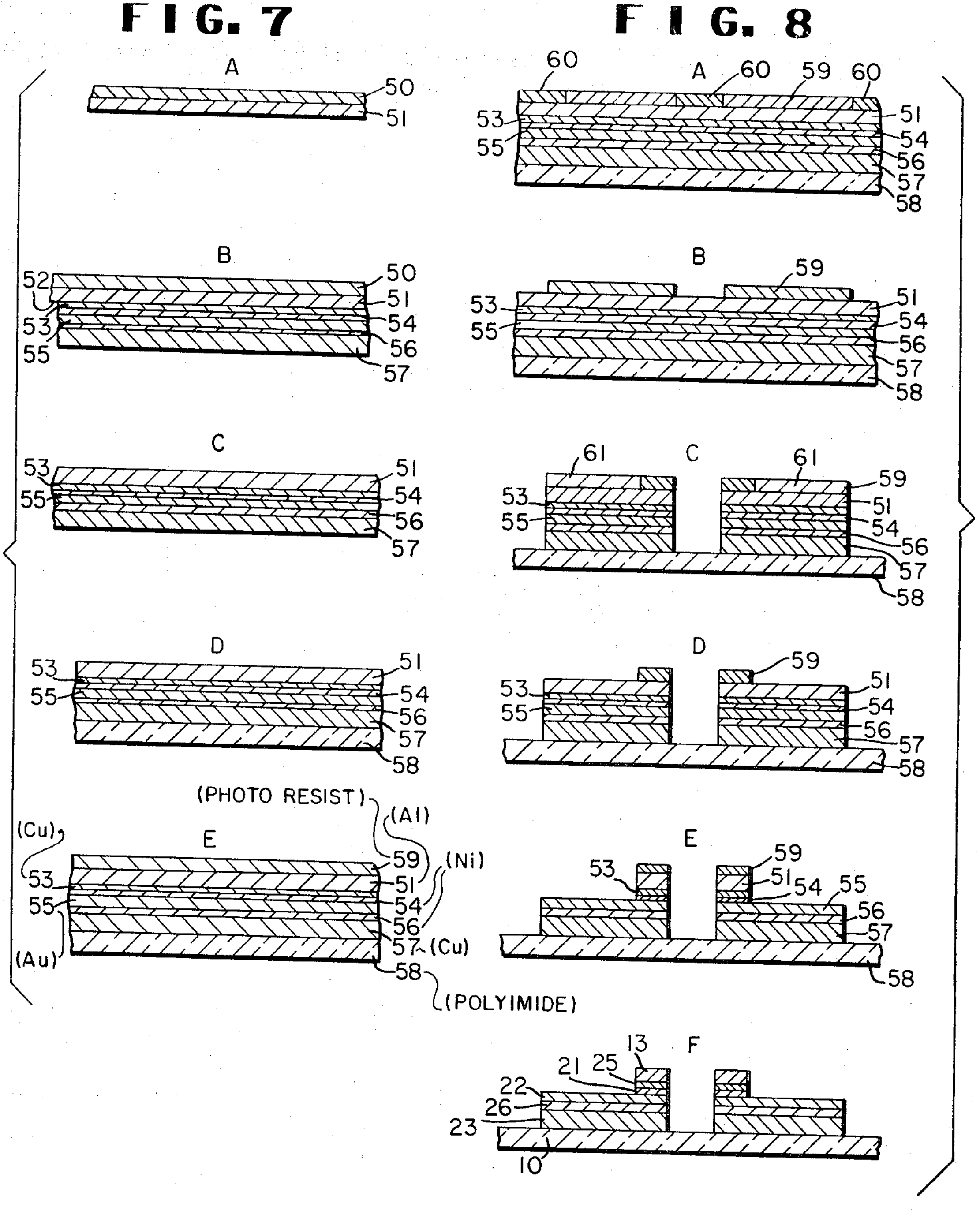
FIGS. 7–10 outline methods of manufacturing the carrier of the present invention.
Figure 9:
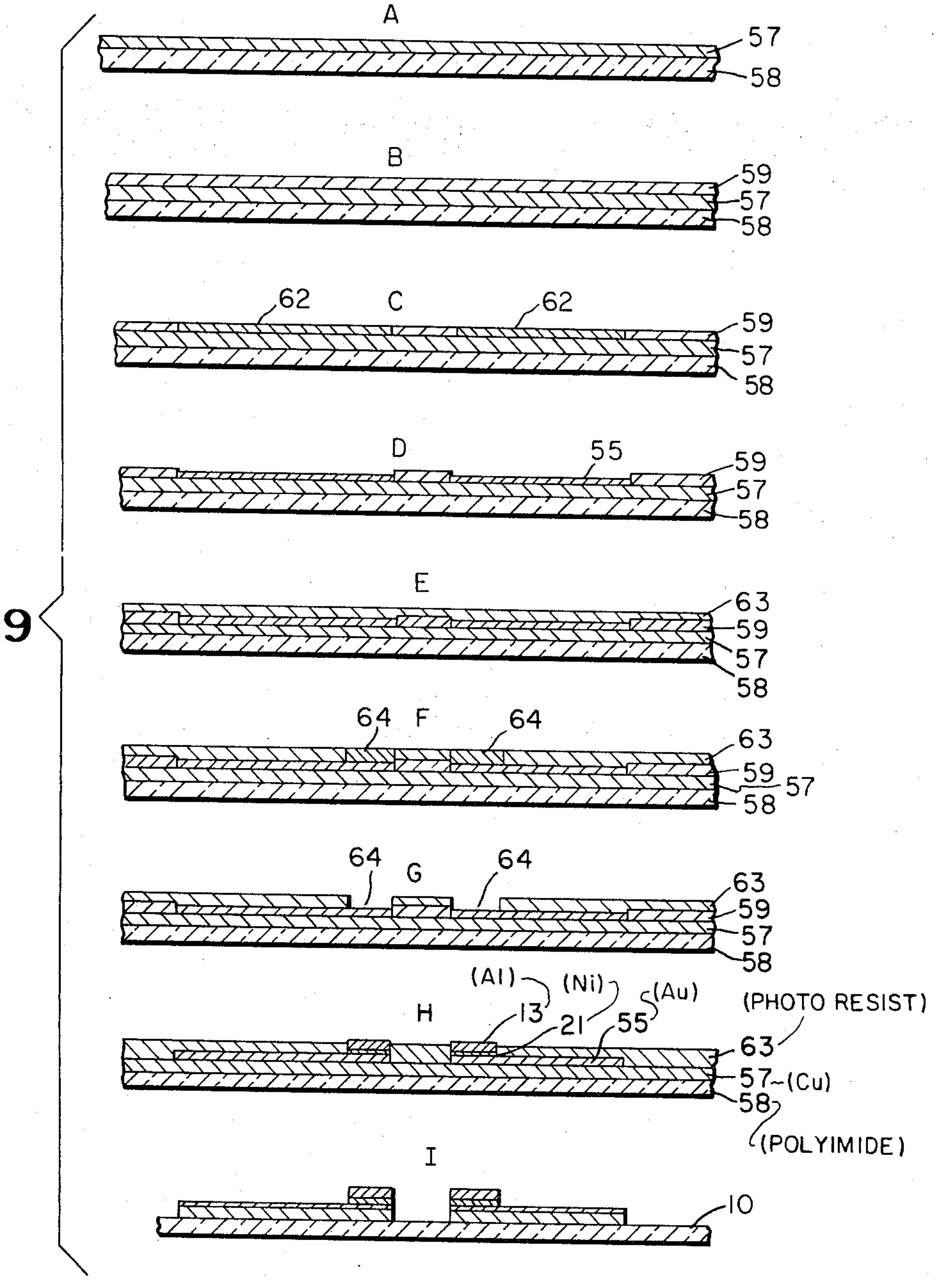

The fabrication of those embodiments of the carrier of the present invention wherein conductors 12 (and optionally pads 13) are a multilayer structure will now be described. Carriers such as those illustrated in FIGS. 3*c* and 3*d* can be constructed by building up a continuous composite structure having the required layers, followed by selective removal of materials to form conductors 12 and pads 13. FIGS. 7–9 outline such fabrication processes.

FIG. 7 illustrates the beginning of the fabrication sequence to obtain the composite structure of FIG. 3d. After buildup of layers pursuant to the scheme outlined in FIG. 7, removal of undesired parts of the various layers can be accomplished by the scheme set forth in FIG. 8. Specifically, in step (a) of FIG. 7, masking 50 is applied to one side of aluminum foil 51 about 1 to 2 mils thick. By masking is meant, for example, a tape such as 3M "Scotch" brand Electroplaters Masking Tape 470/3VEA-03024, or Michigan Chrome and Chemical Company Microflex Stop-off Lacquer. Thereafter, the unmasked surface of aluminum 51 is washed with a hot 30 percent aqueous sodium hydroxide solution.

In step (b) of FIG. 7, the structure is progressively built up with the desired metallic layers by conventional plating techniques. Layer ductility, thickness uniformity and adherence are desired characteristics in fabricating the multilayer metal sandwich. Plating may be accomplished by electro or electroless methods, and is performed in rapid succession under controlled conditions, as is commonly the practice in the art. Specifically, in step (b) a zincate treatment is applied to surface 52 of aluminum 51 to modify the aluminum surface to accept subsequent plating. The resultant immersion zinc-plate layer on the aluminum surface is thought to be displaced during application later of a copper strike. Such zincate solutions include those described on page 224 of the Metal Finishing Guidebook Directory for 1968, Metals and Plastics Publications, Inc., Westwood, New Jersey, of which the second was used here. A thin copper layer 53 is then applied to treated aluminum surface 52, as a strike. Then a barrier layer of nickel 54 is plated onto 53. A bonding layer of gold 55 is plated onto 54, then a barrier layer of nickel 56 is plated onto 55; then a copper layer 57 is plated onto the nickel layer 56, completing the metal sandwich.

In step (c) of FIG. 7 masking 50 is stripped from aluminum 51, and the exposed side of copper 57 is cleaned and prepared for application of plastic film 58 in step (d). The preferred plastic film is polyimide. In the case of polyimide, adhesion of copper to polyimide may be promoted by plating yet an additional layer of chromium or nickel on the copper, before casting or laminating film layer 58 to copper layer 57. Film layer 58 on copper layer 57 is formed preferably by casting precursor polyamic acid directly onto the copper (or chromium or nickel-plated copper) by any suitable means such as roll or wire rod coating. The polyimide is dried at 300° F. and baked at 500°–600° F. to imidize, giving an even smooth transparent tightly adherent coating. Finally in step (e), a sequential imaging photo resist 59 is applied to the aluminum 51 to complete the sandwich. Photo resists which may be employed include Shipley AZ111 or any other positive acting resist. Negative resists such as Eastman Kodak Company KPR or KMER or Du Pont "Riston" film photo resists can be used, but two applications are needed to define pads 13 and conductors 12.

FIG. 8 depicts a method for the conversion of the composite structure produced via the method of FIG. 7 into the structure of FIG. 3d. Conductor patterns 12 with pads 13 are formed by using conventional positive photo resist masking and etching techniques, as illustrated in steps (*a*) through (*f*). In step (*a*) a photo mask of the desired pattern is used to expose to high intensity light selected sections 60 of the photo resist 59. The resist is developed and exposed sections 60 are washed away in step (*b*). The resultant composite is placed in etchant baths or sprays to remove the metal not protected by the remaining photo resist to form conductor 12 in step (*c*). Next, another photo mask, corresponding to the pads 13, is registered over the conductor pattern. High intensity light is used to expose only sections 61, which are removed by developing in step (*d*). The newly uncovered metal sections are etched away in step (*e*), down to, but not including, gold layer 55. Finally, the remaining resist (over aluminum pads 51, just formed) is dissolved and removed in step (*f*), producing the carrier structure depicted in FIG. 3d.

FIG. 9 shows a method for making the structure shown in FIG. 3c by plating up upon a copper 57 polymer film 58 sandwich shown in step (*a*). In step (*b*) a photo resist 59 is applied to copper 57. In step (*c*) sections 62 of the photo resist 59 are exposed to high intensity light. These sections 62 are removed and gold layer 55 is plated on the exposed copper 57 in step (*d*). Next, another photo resist 63 is applied in step (*e*) and sections 64 thereof are exposed to light in step (*f*). These sections 64 are removed in step (*g*) to leave openings at the pad locations 64. In step (*h*) nickel 21 and aluminum 13 are sequentially plated onto the exposed gold 55 to form pads, and in step (*i*) the photo resist is removed and the copper is etched down to the base film 10.

After the completion of the processes of FIG. 8 or FIG. 9, respectively, the multilayer structure may be trimmed to size and perforated with index holes as desired to give a carrier strip of the structure of FIG. 3*c* or FIG. 3d, respectively.

Yet another method for forming the carrier of FIG. 3d does not require the use of a photo-resist layer, and, therefore, does not proceed through the process outlined in FIG. 8. For this alternate method, the starting material is the sandwich produced in step (*d*) of FIG. 7. Electric discharge machining (EDM) techniques are used for pattern formation, i.e., a hard metal tool having a negative image of the pattern to be formed on its underside is used. Voltage is applied across the tool to the carrier (workpiece). Spark erosion removes metal selectively from the sandwich layers. A washing solution is circulated between the tool and the carrier workpiece to remove debris. The pattern thus cut through the metal sandwich leaves nonconducting thermoplastic film layer 10 of the carrier intact.

As indicated above, complex multilayer structures such as those of FIG. 3*d* may not be required by some applications; simpler structures such as those of FIGS. 3*a*, 3*b* and 3*e* may suffice. The simple carrier of FIG. 3a can be prepared by etching a copper layer on a plastic layer foil to form conductor 12 and raised pads 13. The carrier of FIG. 3*b* can be prepared from that of FIG. 3*a* by applying an electroless nickel/boron coating to conductors 12 and pads 13, but not carrier film 10. Details on composition and methods for applying nickel/boron are given above.

Figure 10:
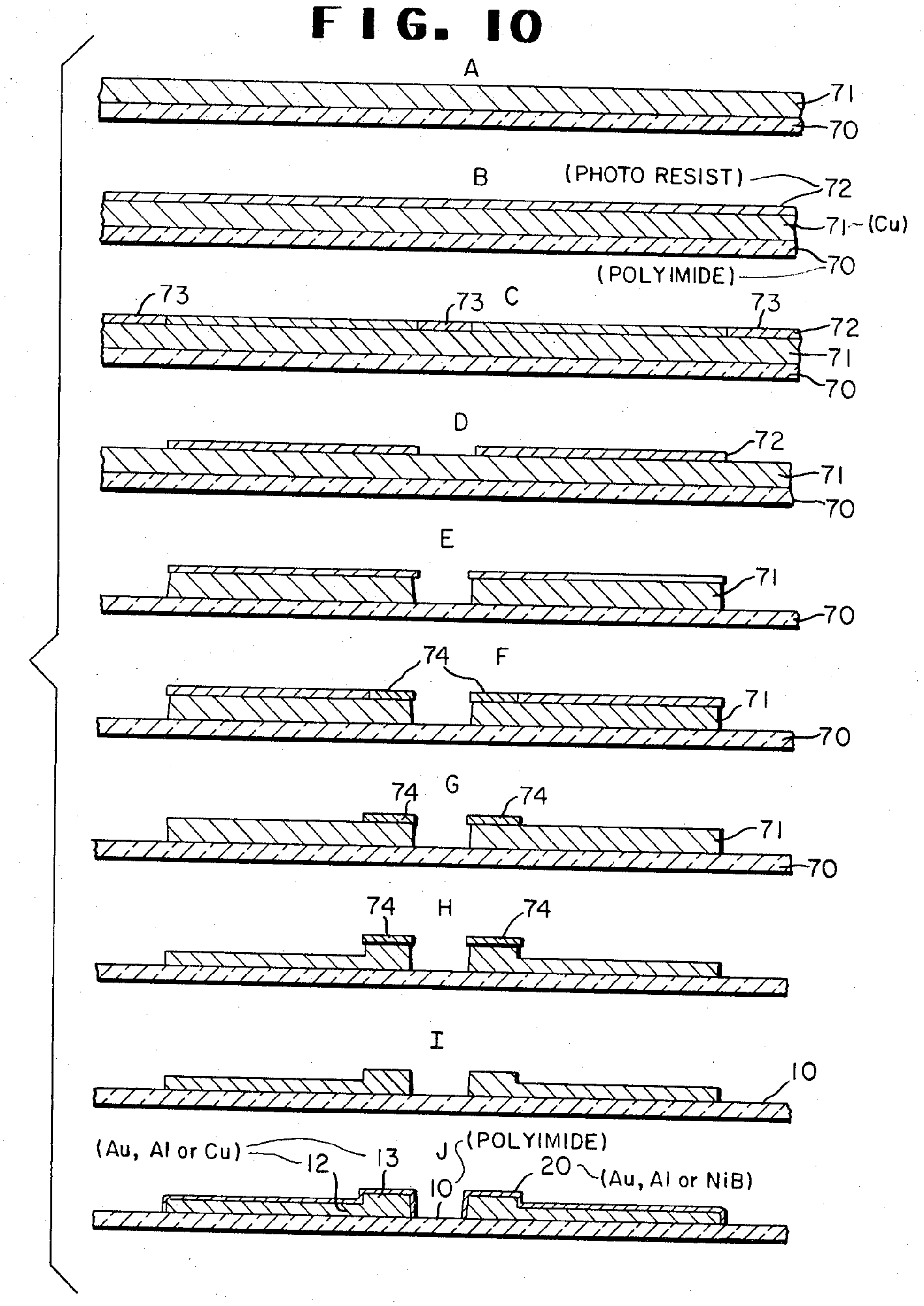

The procedure for making the carrier of FIG. 3*b* is outlined in FIG. 10. A plastic layer 70, with a copper layer 71 about 1 to 2 mils thick, is made by plating copper on plastic layer 70 or by coating the plastic on the copper layer 71, in step (*a*) of FIG. 10. In step (*b*) a double-acting photo resist 72 is applied on copper layer 71. In step (*c*) a mask is used to selectively expose the resist 72 to light at the locations 73. In step (*d*) the exposed portions 73 of the resist 72 are developed and removed, exposing portions of copper 71. In step (*e*) the conductor pattern is etched in the unmasked copper. In step (*f*) another mask is registered over the conductors formed in step (*e*); resist 72 is exposed everywhere but pad locations 74 and removed in step (*g*). In step (*h*) pads are formed by partially etching the uncovered conductors. The remaining resist is removed in step (*i*); finally the nickel/boron is coated in step (*j*), giving the structure shown in cross section in FIG. 3*b*. If step (*j*) is omitted, the structure of FIG. 3*a* is produced. The FIG. 3*e* structure can be made by photoetching aluminum or copper conductors and then selectively masking or activating the copper or aluminum, respectively, to accept solder at the inboard and optionally the outboard bonding sites. Another convenient method is to use De Pont "Formon" solder composition, which can be selectively screen printed on copper conductors and reflowed to form the required pads (the "Formon" will not run but tends to remain where printed during reflow).

EXAMPLES

The present invention is illustrated by the examples above and by the following additional examples. The examples are presented to illustrate, but not to restrict, the present invention. In each of the examples below, film 10 was a polyimide film about 1 mil thick.

EXAMPLE 1

The carrier of FIG. 3a was prepared using aluminum as both conductors 12 and pads 13 by following the technique of steps (*a*)–(*i*) of FIG. 10. Conductor 12 was about 0.5 mil thick and pads 13 about 0.5 mil thick. The carrier was bonded ultrasonically to a 16-terminal integrated circuit chip (0.1 × 0.11 inch). The chip was vibrated against a stationary carrier having 16 aluminum bonding pads, each of which was about 4 mils by 4 mils, and thus smaller than the chip terminals, each of which was 5 mils by 5 mils, by applying a force of about 800 grams to press the chip terminals against the bonding pads. The carrier was held against a plate which exerted resisting force through the carrier film to the bonding pads, generating compression force at the chip/pad interface, which with ultrasonic forces resulted in bond formation. The resultant bonded chips had shear strengths of 20 grams per terminal (320 grams per chip). The carrier-mounted chip was then thermally bonded to a substrate by forming a eutectic silicon-gold bond with a gold die bonding pad on the substrate; thereafter the aluminum carrier conductors were ultrasonically bonded through the carrier film to gold thick film substrate metallizations. The gold employed was Du Pont Number 8389 gold, and the shear strength was about 200 grams per conductor lead.

The package was then tested and found to perform quite satisfactorily both in terms of electrical characteristics (no shorts and low resistance) and ability to withstand handling.

EXAMPLE 2

The carrier of FIG. 3*d* was prepared by the process of FIGS. 7 and 8, using in step (*a*) of FIG. 7 the above-mentioned masking tape. The thicknesses of the respective layers and means of plating were approximately the following: aluminum foil 13, 1 mil; copper cyanide strike 25, 0.01 mil; nickel 21 plated by Watts bath, 0.10 mil; gold 22, 0.20 mil (Sel-Rex Pur-A-Gold 125); nickel 26, plated by Watts bath, 0.10 mil; and copper 23 by acid copper plating, 0.75 mil. Plating of each of the above layers was by electrolysis. The zincate solution indicated above was used to treat aluminum surface 24.

The carrier was ultrasonically bonded to the integrated circuit chip described in Example 1, in the same way as there described, and then the resultant carrier-mounted chip was die bonded to a gold substrate pad as in Example 1. Thereafter, the gold plated carrier conductors were thermocompression bonded to Du Pont Number 8380 gold thick film substrate conductors by pressing a hot tool against the plastic to bond each carrier conductor to each substrate conductor. The shear strengths of the individual leads was about 250 grams.

The package was then tested and found to perform quite satisfactorily both in terms of electrical characteristics and ability to withstand handling, as in Example 1.

EXAMPLE 3

The carrier of FIG. 3*b* was prepared per FIG. 10, copper being both conductor 12 and pads 13, each coated with nickel/boron.

Conductor 12 was 0.7 mil thick, pad 13 was 0.7 mil thick, and the nickel/boron coating 20 about 0.1 mil thick. Bonding to form a package was accomplished as in Example 2.

The carrier of the present invention may be used to package chips in a number of ways. Multiple bonds between carrier and chip may be formed simultaneously and quickly by ultrasonic or thermocompression techniques. First, the active face of the chip is bonded to the carrier metallizations (inboard bonding); then the nonactive face of the chip is die bonded to the substrate (eutectic, solder or adhesive); and then the conductor patterns on the carrier film are bonded to the substrate conductor patterns (outboard bonding) by ultrasonic or thermocompression techniques.

Since the carrier film of the present invention is transparent, bonding may proceed by individual optical alignment and thereafter, where the chips and substrates are uniform, by automated alignment of strips of carriers. The above-mentioned copending application Ser. No. 118,805 illustrates preferred apparatus for this purpose.

In the carriers of the present invention, the various plastic and metal layers are adherent to one another. Those skilled in the art will employ various treatments to promote layer to layer adhesion. The polyimide film/copper layer composite used in making one embodiment of the present invention can be purchased commercially or can be made either by laminating a polyimide film to a copper layer or by casting precursor polyamic acid on a copper layer.

We claim:

1. A carrier for semiconductor chips, for use in bonding such chips to a substrate, said carrier comprising a. a flexible transparent, polymeric film as a base; b. metallic conductor patterns on film a.; and c. metallic bonding pads on the inner ends of b. for contact between patterns b. and the chip, wherein b. and c. together are a multilayer structure comprising, in sequence, layers of copper, gold, nickel and aluminum, the copper layer being adjacent to and adherent to film a., and the upper most layer of c. being aluminum.

2. A chip carrier according to claim 1 wherein film a. is a polyimide.

3. A chip carrier according to claim 1 wherein metallic conductor patterns b. are of substantially uniform thickness.

4. A chip carrier according to claim 1 which additionally comprises a layer of chromium or nickel between a. and b.

5. A chip carrier according to claim 1 wherein the area of said gold layer is coextensive with that of said copper layer, to form a two-layer structure in b., and wherein the area of said nickel layer is coextensive with that of aluminum, to form a two-layer structure in c.

6. A chip carrier according to claim 1 wherein b. and c. together are a multilayer structure comprising, in sequence, layers of copper, nickel, gold, nickel, copper and aluminum, the first copper layer being adjacent to film a.

7. A chip carrier according to claim 1 wherein the area of said copper, nickel and gold layers is coextensive to form a three-layer structure in b.; and wherein the area of said nickel, copper and aluminum layers is coextensive to form a three-layer structure in c.

8. A chip carrier according to claim 1 which additionally comprises a layer of chromium or nickel between a. and b.

9. A carrier for semiconductor chips as recited in claim 1, wherein said film is a continuous film bearing a series of said conductor patterns b and bonding pads (c), from which film an individual chip carrier may be cut.

10. A carrier for semiconductor chips as recited in claim 9 which additionally includes sprocket holes for indexing said continuous film between the conductor patterns (b).

11. A carrier for semiconductor chips as recited in claim 10 additionally including a multiplicity of chips bonded thereto.

12. A carrier for semiconductor chips as recited in claim 1 additionally including a semiconductor chip and a substrate having conductors thereon, said chip connected to said conductors on said substrate through pads c on conductors b on said carrier.

13. A carrier as recited in claim 1 additionally including a semiconductor chip bonded to said pads (c) on said conductors (b) on the chip carrier.

* * * * *